United States Patent
Sutardja (10) Patent No.: US 9,312,176 B2
(45) Date of Patent: Apr. 12, 2016

(54) REMOVING CONDUCTIVE MATERIAL TO FORM CONDUCTIVE FEATURES IN A SUBSTRATE

(71) Applicant: Marvell World Trade Ltd., St. Michael (BB)

(72) Inventor: Sehat Sutardja, Los Altos Hills, CA (US)

(73) Assignee: Marvell World Trade Ltd., St. Michael (BB)

(*) Notice: Subject to any disclaimer, the term of this patent is extended or adjusted under 35 U.S.C. 154(b) by 0 days.

(21) Appl. No.: 14/500,692

(22) Filed: Sep. 29, 2014

(65) Prior Publication Data

US 2015/0024590 A1    Jan. 22, 2015

Related U.S. Application Data

(63) Continuation of application No. 13/633,825, filed on Oct. 2, 2012, now Pat. No. 8,847,364.

(60) Provisional application No. 61/542,744, filed on Oct. 3, 2011.

(51) Int. Cl.
*H01L 21/768* (2006.01)
*H01L 23/48* (2006.01)

(52) U.S. Cl.
CPC .... *H01L 21/76898* (2013.01); *H01L 21/76802* (2013.01); *H01L 21/76816* (2013.01); *H01L 21/76831* (2013.01); *H01L 21/76877* (2013.01); *H01L 23/481* (2013.01); *H01L 2924/0002* (2013.01)

(58) Field of Classification Search
CPC ............... H01L 21/76898; H01L 21/76877; H01L 21/76816; H01L 21/76802; H01L 21/76831; H01L 23/481
See application file for complete search history.

(56) References Cited

U.S. PATENT DOCUMENTS

| 4,543,715 A | 10/1985 | Iadarola et al. |
| 6,077,780 A * | 6/2000 | Dubin ............... H01L 21/76834 257/E21.584 |
| 7,994,044 B2 * | 8/2011 | Topacio ................. H01L 24/03 257/704 |
| 2004/0251047 A1 | 12/2004 | Bartley et al. |
| 2006/0043598 A1 | 3/2006 | Kirby et al. |
| 2006/0148250 A1 | 7/2006 | Kirby |
| 2009/0008780 A1 | 1/2009 | Kirby |
| 2009/0057912 A1 * | 3/2009 | Kheng ................ H05K 3/4602 257/774 |
| 2009/0243120 A1 | 10/2009 | Kita et al. |
| 2010/0314742 A1 | 12/2010 | Kim |

* cited by examiner

*Primary Examiner* — Marc Armand
*Assistant Examiner* — Christina Sylvia (57) ABSTRACT

Apparatuses having, and methods for forming, conductive features are described. A hole is formed in a substrate and a conductive material is deposited in the hole. A part of the conductive material that occupies a first lengthwise portion of the hole is removed, and a conductive feature that occupies a second lengthwise portion of the hole remains in the substrate.

23 Claims, 9 Drawing Sheets

REMOVING CONDUCTIVE MATERIAL TO FORM CONDUCTIVE FEATURES IN A SUBSTRATE

CROSS REFERENCE TO RELATED APPLICATIONS

This present disclosure is a continuation of and claims priority to U.S. patent application Ser. No. 13/633,825, filed Oct. 2, 2012, now U.S. Pat. No. 8,847,364, issued Sep. 30, 2014, which claims priority to U.S. Provisional Patent Application No. 61/542,744, filed Oct. 3, 2011, which are incorporated herein by reference.

TECHNICAL FIELD

Embodiments of the present disclosure relate to the field of integrated circuits, and more particularly, to techniques for forming through-silicon vias.

BACKGROUND

The background description provided herein is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

Integrated circuit devices, such as transistors, are formed on semiconductor dies or chips. Integrated circuit features continue to scale in size to smaller dimensions. The shrinking dimensions of these features are challenging conventional techniques of forming features, such as through-silicon vias (TSVs), within a substrate.

Conventional vias are fabricated using chemical etching to produce a tunnel through the silicon or other substrate material. The hole is then filled with a conductive material to form a via. Conventional chemical etching techniques, if applied to the formation of relatively small TSVs, such as vias on the order of 10-20 μm in diameter, result in cone-shaped TSVs that have relatively large diameters at the top of the silicon surface, and relatively small diameters at the bottom of the silicon surface. As a result, the TSVs formed using conventional techniques cannot be situated close together, or close to other packaging or integrated circuit features, somewhat obviating the benefits of small-diameter TSVs.

SUMMARY

In one embodiment, the present disclosure provides a method of forming a conductive feature. A hole is formed in a substrate and a conductive material is deposited into the hole. A part of the conductive material that occupies a first lengthwise portion of the hole is removed, such that at least one conductive feature occupying a second lengthwise portion of the hole remains. The hole may include a groove that extends outward from a center of the hole and that traverses a vertical dimension of the hole. The conductive features may be disposed at least partially within the groove.

In another embodiment, the present disclosure provides an apparatus with a substrate and a hole defined with the substrate. A first conductive feature traverses from a top surface of the substrate to a bottom surface of the substrate. The first conductive feature is formed by removing a lengthwise contiguous portion of the substance that was deposited in the hole. The first conductive feature may be a through-silicon via. The hole may include a center portion and a plurality of side features, and the first conductive feature may be disposed in one of a plurality of side features.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe methods of fabricating through-silicon vias and other similar packaging and integrated circuit features. Embodiments include fabricating conductive features that are relatively small, such as vias with diameters less than 20 μm. As previously noted, conventional chemical etching techniques are unsuited for fabricating vias that have relatively small diameters because such techniques result in cone-shaped vias. Techniques disclosed herein include drilling relatively large holes in a substrate, coating the interior surfaces of those holes with a conductive material, and then removing a portion of the conductive material so that one or more relatively small vertical conductive features remain within the hole.

Figure 1A:
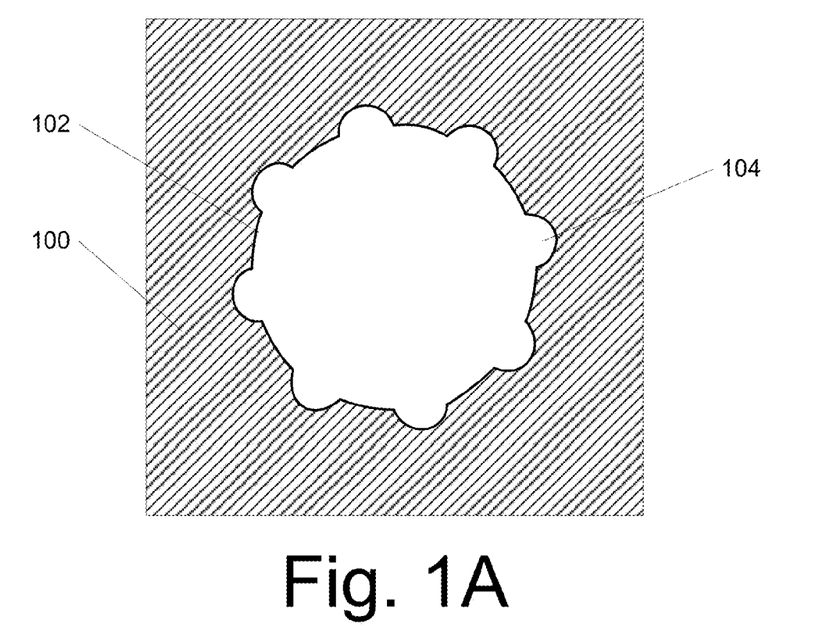
FIGS. 1A-D illustrate top-level views of a substrate having conductive features at various stages of fabrication.

FIGS. 1A-D illustrate top-level views of a substrate having conductive features at various stages of fabrication. Referring to FIG. 1A, a hole 102 is formed in substrate 100. The hole 102 is drilled, such as for example using a mechanical drill, laser drill, or some other drill type. In the example shown in FIGS. 1A-D, the hole 102 includes several side features 104. The side features 104 may be grooves, channels, or other features that extend outward from the center of the hole 102 and run lengthwise down the hole 102 from a bottom surface of the substrate 100 to a top surface of the substrate 100. The side features 104 may have different shapes, e.g., round, semi-circular, square or rectangular. The substrate 100 may include Silicon (Si), silicon-germanium (SiGe), germanium (Ge), gallium arsenide (GaAs), or other suitable substrate material.

Figure 1B:
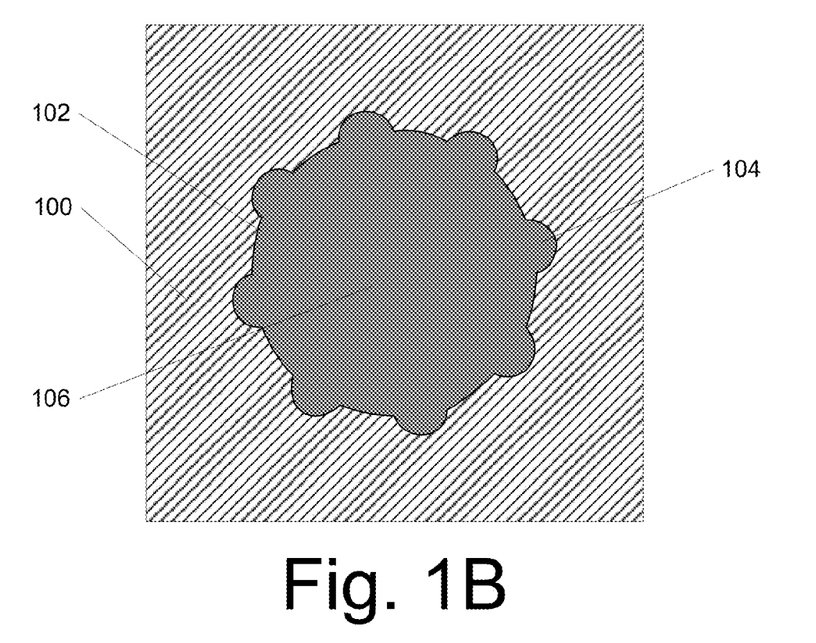
Figure 1C:
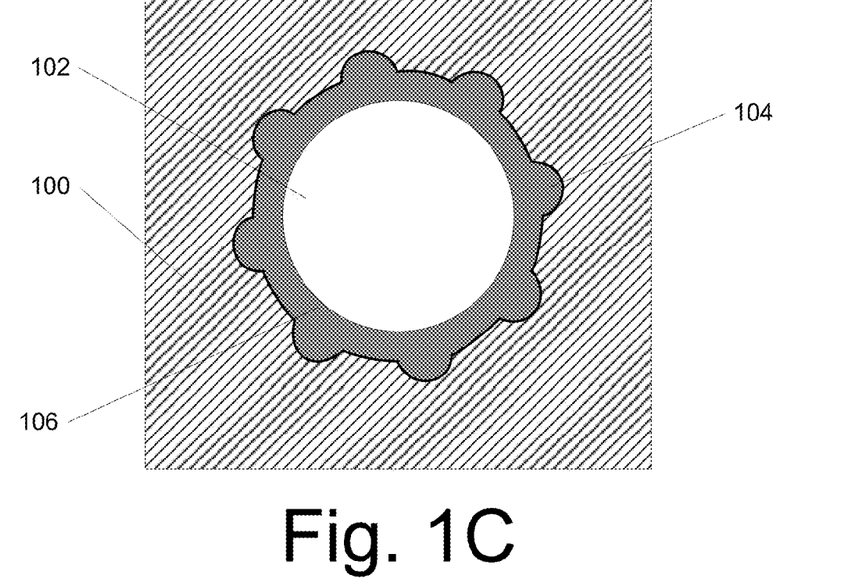

Referring to FIG. 1B, a conducive material 106 is placed into the hole 102. The conductive material 106 may be, for example, aluminum (Al), copper (Cu), aluminum-copper alloy, nickel (Ni), or other conductive material. The conductive material 106 is deposited by electrodeposition, evaporation, a sputtering process, or other suitable process. Although the example illustrated in FIG. 1B shows that the hole 102 is completely filled with the conductive material 106, in embodiments a portion of the hole 102 may be unfilled. An example of this is illustrated in FIG. 1C, where the conductive material 106 is placed into the hole 102 sufficient to coat the internal surface of the hole 102 and to fill the side features 104.

Figure 1D:
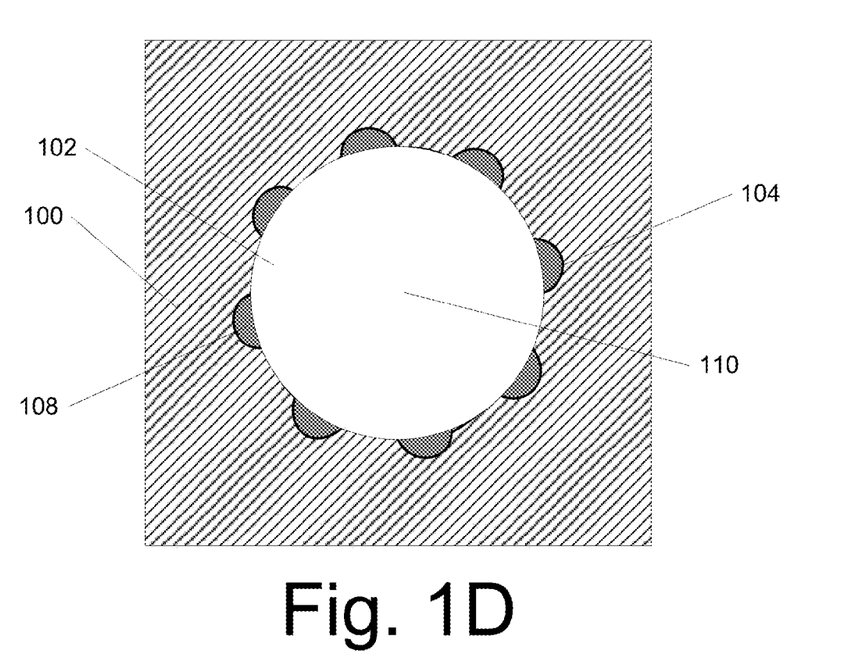

One or more lengthwise portions of the conductive material 106 are etched away, such as by employing, for example, chemical etching, or some other etching process. In FIG. 1D, the conductive material 106 is shown etched away until one or more conductive features 108 remain. The conductive features 108 occupy lengthwise portions of the hole 102. In the example shown in FIG. 1D, the conductive features 108 are disposed within the side features 104. A material, such as a non-conducting dielectric material, may be deposited into a center portion 110 of the hole 102 after the portion of the conductive material 106 has been etched away. The dielectric material (not illustrated) may fully or partially fill the center portion 110. The conductive features 108 may be used as through-silicon vias (TSVs), through package vias (TPV), or similar features.

The conducive material 106 is etched away at least until the resulting conductive features 108 are physically separate from one another. The dielectric material deposited into the center portion 110 may enhance the electrical isolation between the conductive features 108.

The diameter of the hole 102 may be approximately 50 µm to 200 µm, and the widest lateral dimension of the conductive features 108 may be less than 20 µm, such as on the order of 5 µm to 20 µm. Also, adjacent conductive features 108 may be relatively close to one another, such as between 5 µm and 40 µm apart. As previously noted, forming a TSV or other conductive feature with such relatively small dimensions using a conventional chemical etching process generally results in cone-shaped TSVs, making it difficult or impossible to space such TSVs close together without one TSV impinging on another TSV. But embodiments of the present disclosure include conductive features, such as conductive features 108, that have substantially uniform shape and size along their lengths, and may therefore be spaced relatively close together, thereby occupying less space than if conventional processes for forming conductive features were used.

FIGS. 1E-I illustrate top-level views of an example embodiment of a conductive feature 108 at various stages of fabrication. While only one conductive feature 108 is illustrated, it is to be understood that FIGS. 1E-I apply to multiple conductive features 108.

Figure 1E:
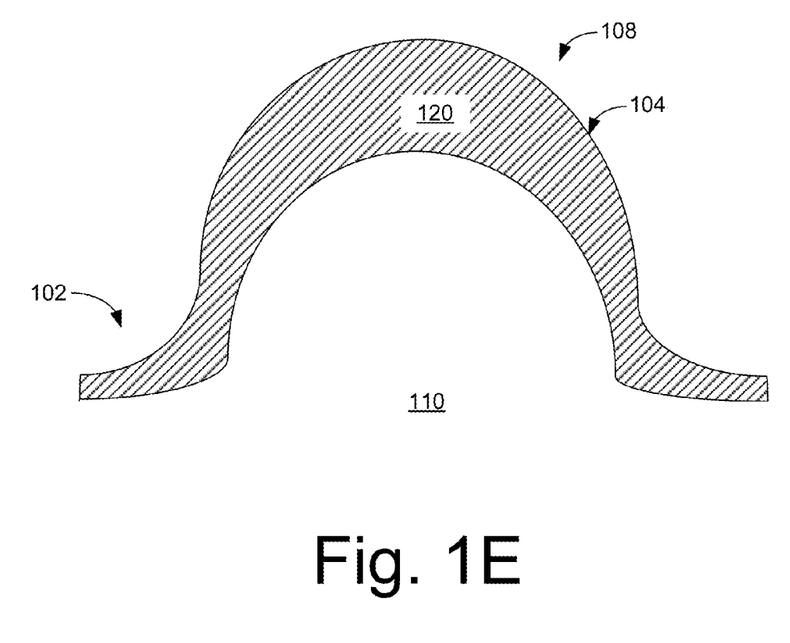
FIGS. 1E-I illustrate top-level views of an example embodiment of a conductive feature at various stages of fabrication.

FIG. 1E illustrates a dielectric or insulating layer 120 being deposited within the hole 102. The dielectric layer 120 is deposited to generally conform to the contours of the side feature 104. The dielectric layer 120 can be etched if desired such as by employing, for example, chemical etching, or some other etching process.

Figure 1F:
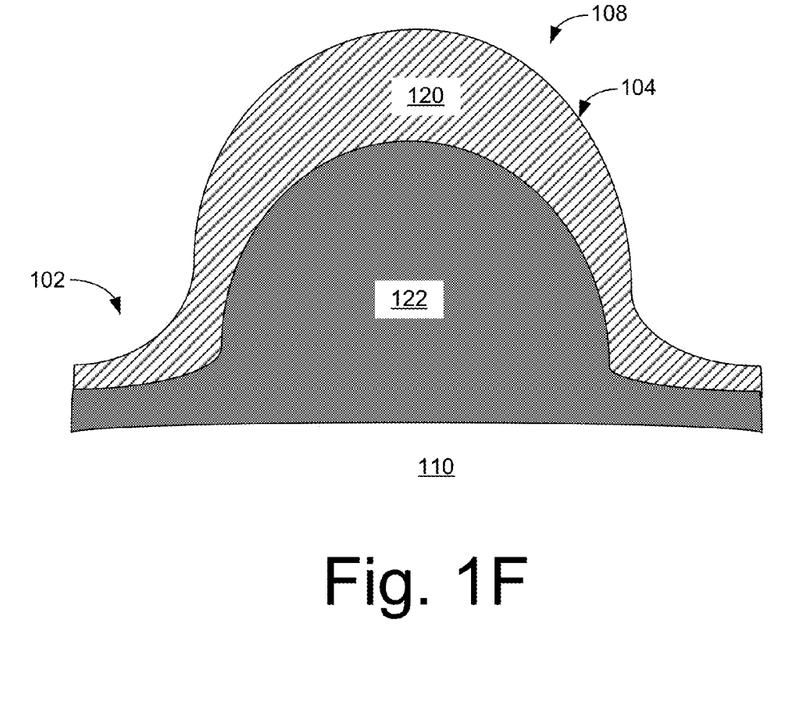
Figure 1G:
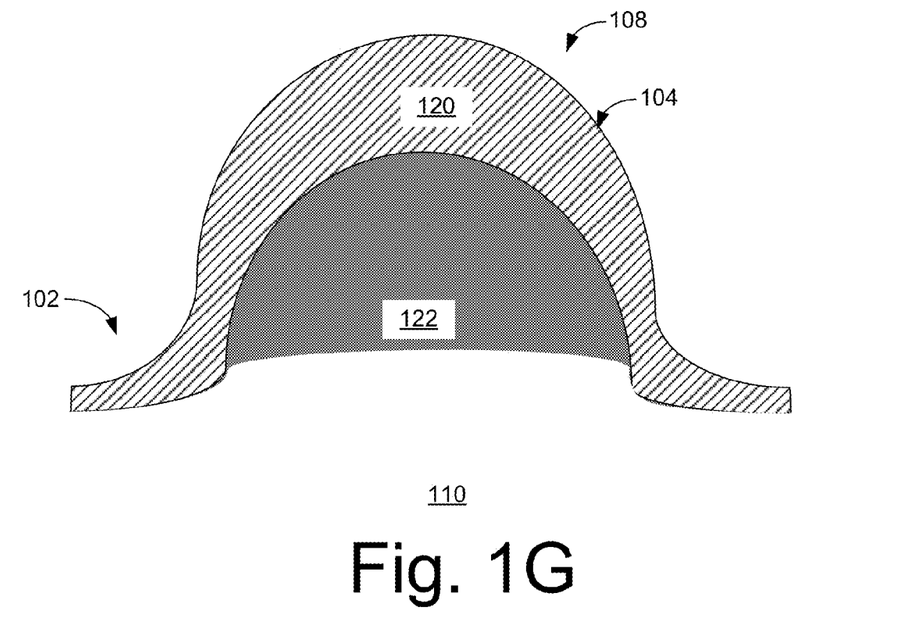

FIG. 1F illustrates a conductive material being deposited within the hole 102 over the dielectric layer 120 to provide a metal layer 122. The conductive material may be, for example, aluminum (Al), copper (Cu), aluminum-copper alloy, nickel (Ni), or other conductive material. The conductive material is deposited by electrodeposition, evaporation, a sputtering process, or other suitable process. As illustrated in FIG. 1G, the metal layer 122 is then etched so that the metal layer 122 is substantially within the conductive feature 108.

Figure 1H:
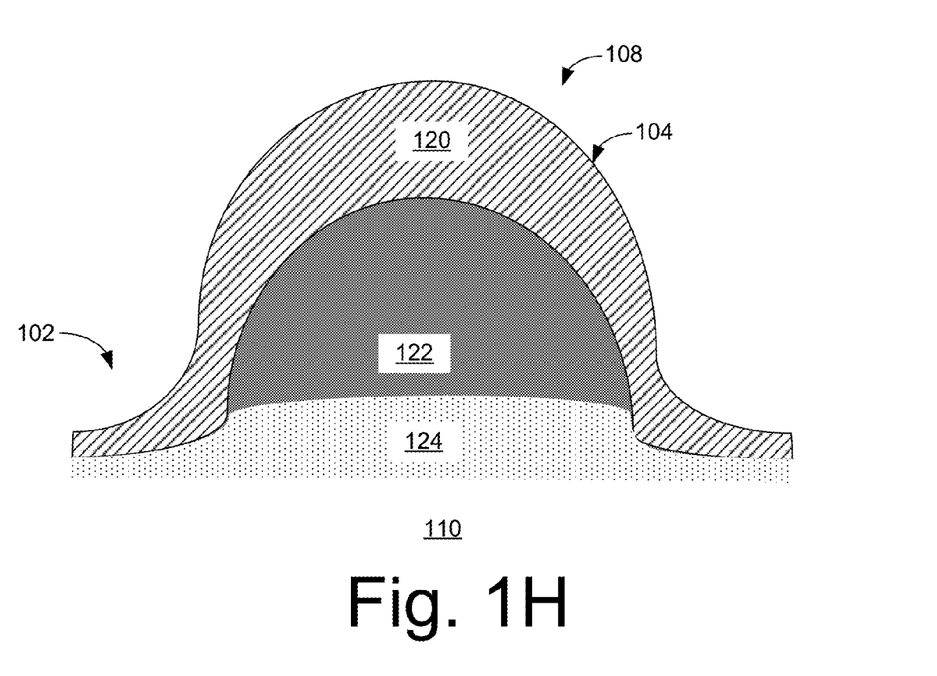

FIG. 1H illustrates another dielectric layer 124 being deposited within the hole 102 over the metal layer 122. The dielectric layer 124 can be etched if desired. This other dielectric layer 124 is used to insulate the metal layer 122.

Figure 1I:
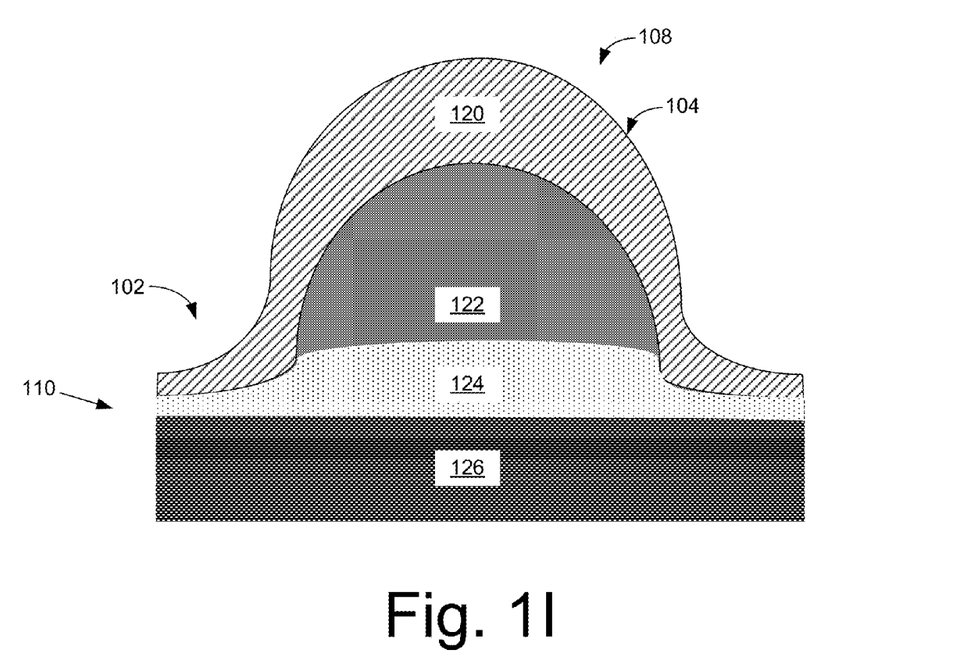

Referring to FIG. 1I, the center portion 110 of the hole 102 can then be filled with material 126. In accordance with various embodiments, the material 126 is a dielectric material. In such embodiments, the dielectric material deposited into the center portion 110 may enhance the electrical isolation between the conductive features 108. In accordance with other embodiments, the material 126 is a conductive material. In such embodiments, the conductive material within the hole 102 allows for a connection to, for example, ground.

Figure 2A:
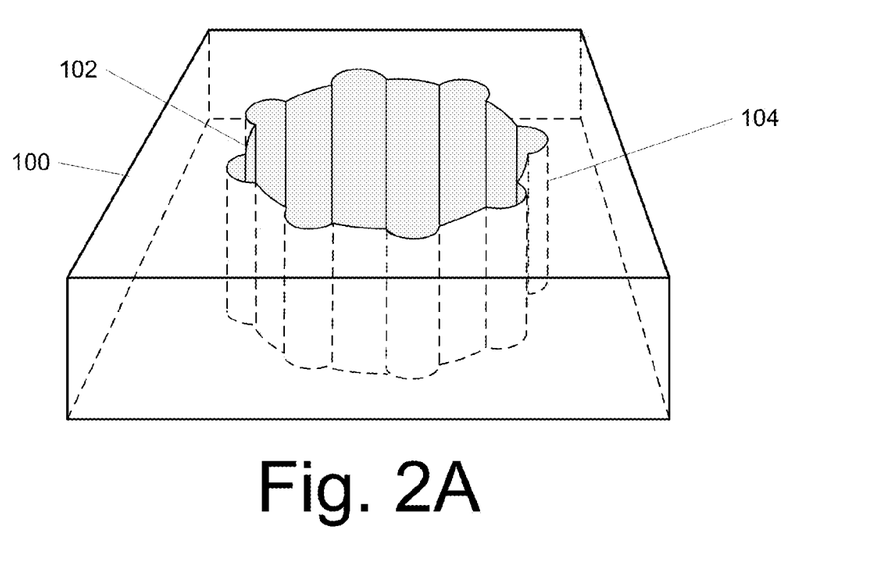
FIGS. 2A-D illustrate three-dimensional perspective views of a substrate having conductive features at various stages of fabrication.
Figure 2B:
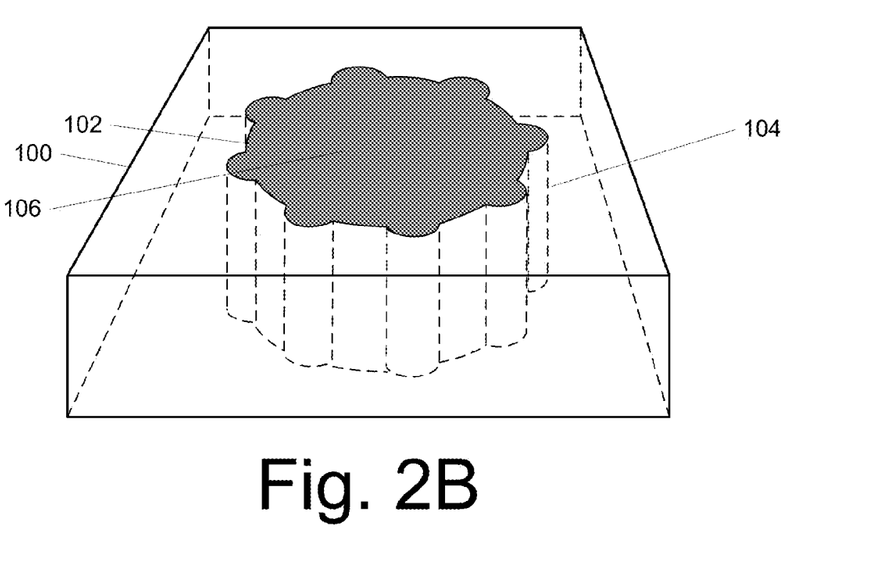
Figure 2C:
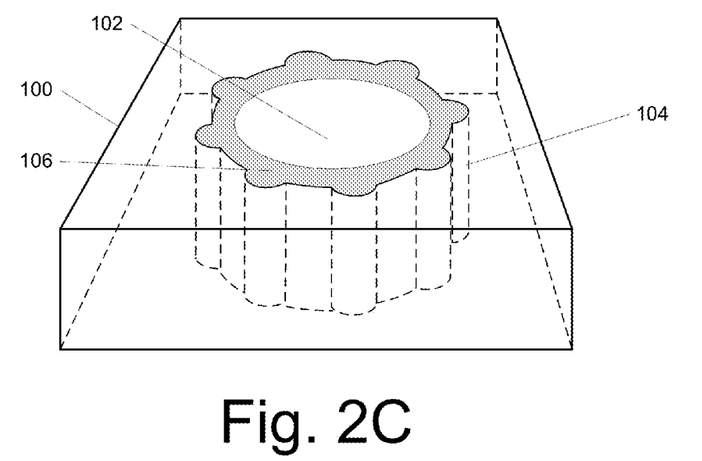

FIGS. 2A-D illustrate three-dimensional perspective views of a substrate having conductive features at various stages of fabrication. FIG. 2A corresponds to the same or similar stage of fabrication illustrated in FIG. 1A. FIG. 2B corresponds to the same or similar stage of fabrication illustrated in FIG. 1B. FIG. 2C corresponds to the same or similar stage of fabrication illustrated in FIG. 1C. And FIG. 2D corresponds to the same or similar stage of fabrication illustrated in FIG. 1D.

Figure 2D:
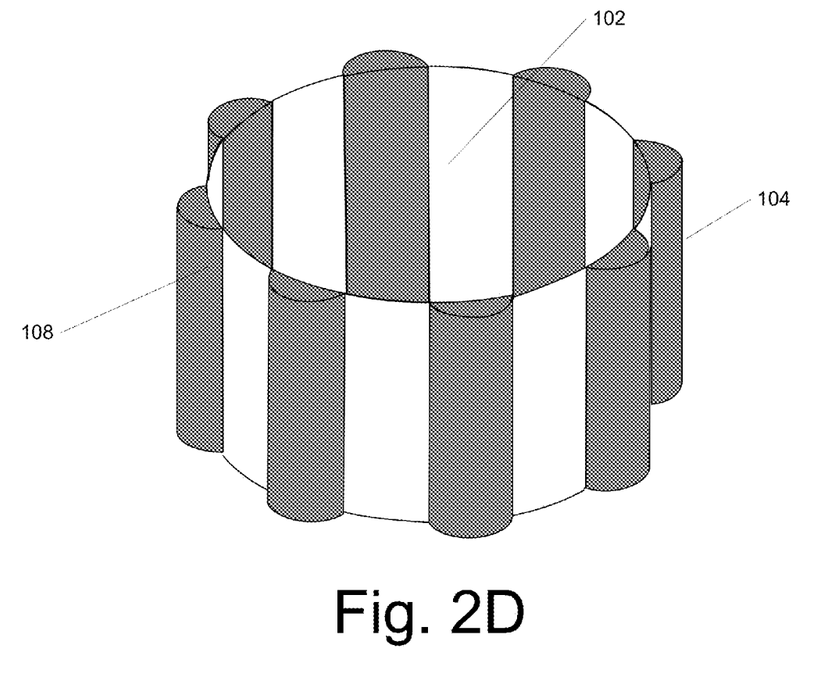

Referring to FIG. 2D, the conductive features 108 traverse a lengthwise dimension of the hole 102. Thus, the conductive features 108 can serve as conductors for features situated on or near the top and bottom of the substrate 100.

Figure 3A:
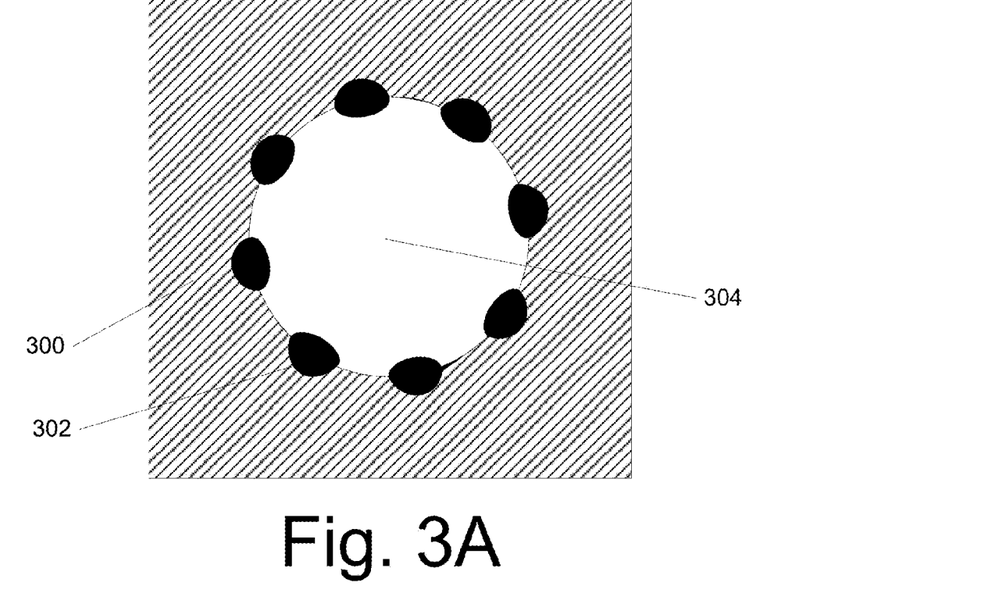
FIGS. 3A and 3B illustrate top-level views of example conductive features according to various embodiments.
Figure 3B:
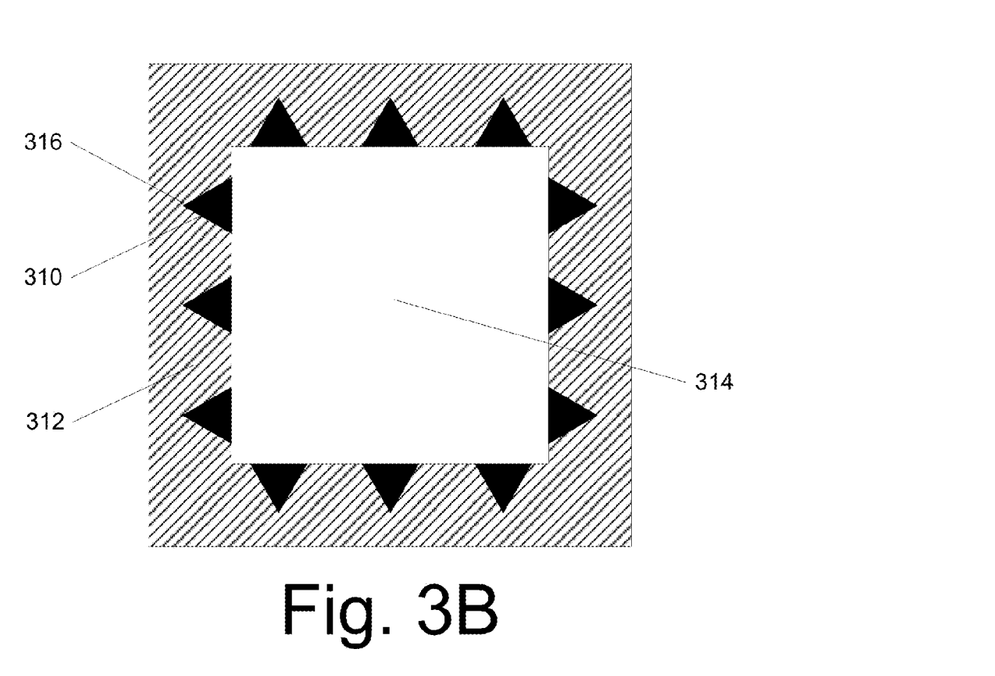

FIGS. 3A and 3B illustrate top-level views of example conductive features according to various embodiments of the present disclosure. The examples illustrated in FIGS. 1A-D show the formation of conductive features that wholly occupy the side features, or grooves, formed in the outer edges of the holes. In the embodiments of FIGS. 1A-D, the conductive material is etched away such that the conductive features 108 are flush with an interior surface of the hole 102 in which they are formed. The example shown in FIG. 3A illustrates a substrate 300 with conductive features 302 formed by etching away the conductive material to a point at which the conductive features are physically separate from one another, but are not flush with the interior surface of the hole and extend inward towards a center of the hole 304. In this way, the conductive features 302 formed according to embodiments may take on various shapes.

In the example illustrated in FIG. 3B, triangle-shaped conductive features 310 are formed into a substrate 312 by coating the interior surfaces of a hole 314 having a square-shaped interior portion and triangular-shape side features 316. Although the example shown in FIG. 3B illustrates conductive features 310 that are flush with the interior of the hole 312, the conductive features 310 may also be formed such that they extend inward towards the hole, similar to the conductive features 302 illustrated in FIG. 3A.

The examples illustrated in FIGS. 1A-D and FIGS. 2A-D include circular holes 102, with rounded side features 104. But embodiments, such as, for example, the embodiment illustrated in FIG. 3B, are not limited to circular-shaped holes and rounded side features. The inner portion of the holes may be, in various embodiments, substantially square, rectangular, elliptical, triangular, parallelograms, quadrangular, polygonal, and so forth. The side features may likewise be, in various embodiments, curved, triangular, square, quadrangular, parallelograms, polygonal, and so forth. In various embodiments, holes may be formed in the substrate without side features or grooves. For example, a square-shaped hole may be formed in a substrate, a conductive material deposited to coat the interior surfaces of the square-shaped hole, and then an etching process utilized to leave only the corners of the square-shaped hole filled with the conductive material, thereby forming four conductive features in the corners that traverse the hole lengthwise. Similar embodiments could utilize triangular-shaped holes, star-shaped holes, pentagon-shaped holes, and so forth.

Figure 4:
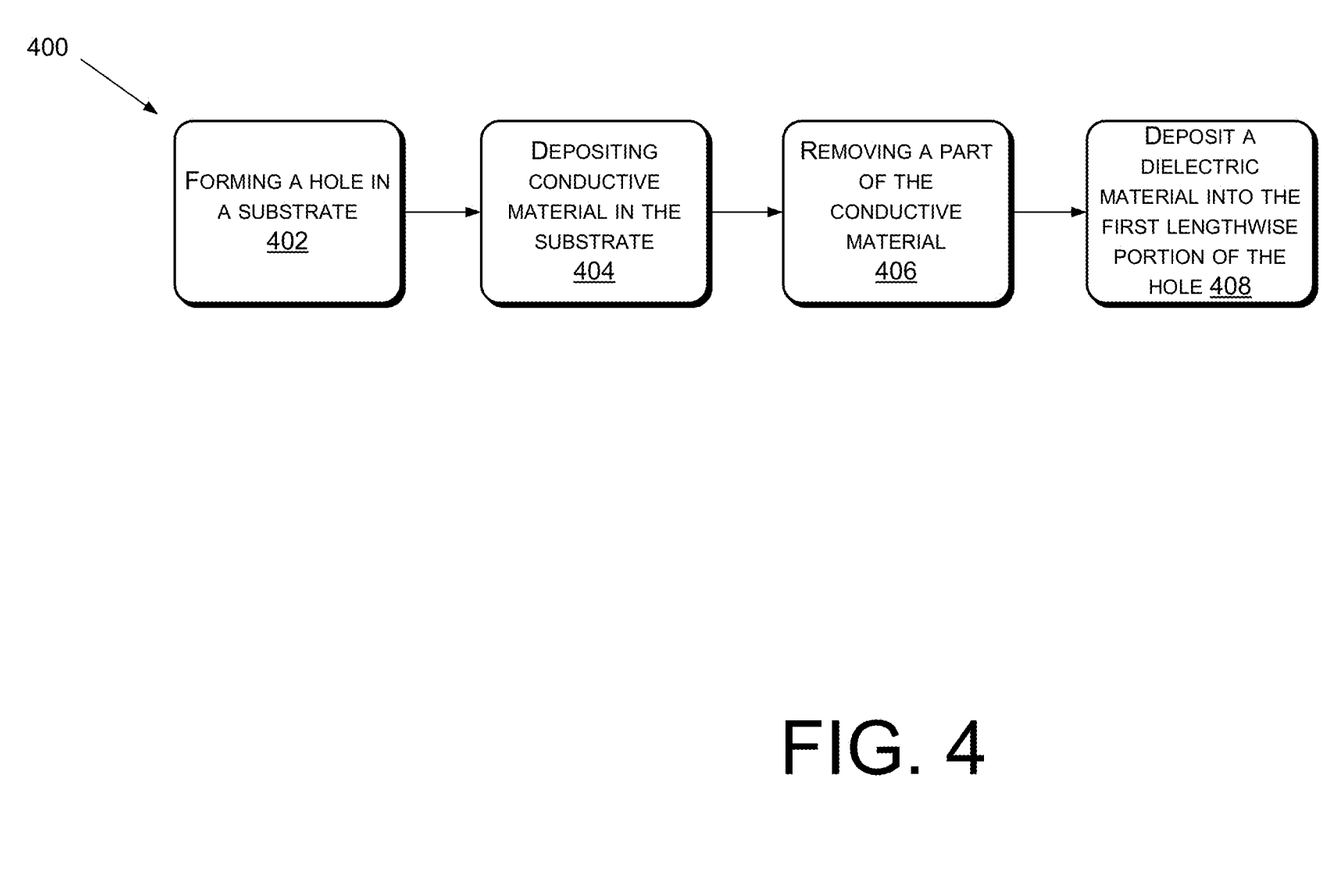
FIG. 4 is a process flow diagram of a method to fabricate a semiconductor package described herein.

FIG. 4 is a process flow diagram of an example of a method 400 to fabricate a semiconductor package described herein with respect to FIGS. 1A-D, 2A-D and 3A-B. At 402, a hole is formed in a substrate. The substrate may include Silicon (Si), silicon-germanium (SiGe), germanium (Ge), gallium arsenide (GaAs), or other suitable substrate material. The hole may be drilled such as with a mechanical or laser drill, or formed in some other suitable manner. The hole may include one or more side features, such as grooves or channels, that extend outward from the center of the hole and that traverse a vertical dimension of the hole.

The hole may be one of various shapes. For example, the hole may be substantially square, rectangular, elliptical, triangular, a parallelogram, quadrangular, polygonal, irregular, or some other shape. In embodiments where the hole includes side features, such as grooves or channels, an inner portion of the holes may be, in various embodiments, substantially square, rectangular, elliptical, triangular, a parallelogram, quadrangular, polygonal, irregular, and so forth. In such embodiments, the side features may be curved, triangular, square, quadrangular, parallelograms, polygonal, irregular, and so forth. Embodiments are not limited to holes and side features of any particular shape or shapes.

At 404, a conductive material is deposited into the hole. The conductive material may completely or partially fill the hole. In any event, the conductive material is deposited sufficient to substantially coat the inner surface of the hole, including filling one more side features in embodiments where the hole is formed with one or more side features. The conductive material may be aluminum (Al), aluminum-copper alloy, copper (Cu), nickel (Ni), or other conductive material.

At 406, a part of the conductive material is removed from the hole. A part of the conductive material that occupies a first lengthwise portion of the hole is removed, such that at least one contiguous portion of the conductive material that occupies a second lengthwise portion of the hole remains in the substrate. The part of the substrate that is removed previously traversed the length of the hole, and the part of the substrate that remains also traverses the length of the hole. In embodiments where the hole has side features, such as grooves or channels, the portion of the conductive material that remains is at least partially disposed in one of the side features. Where multiple side features are present in the hole, multiple parts of the conductive material remain in the hole, at least partly situated in the side features. Where multiple conductive features remain in the hole upon removal of a part of the conductive material, the multiple conductive features are physically separate from one another, such that they are usable as separate vias or other conductive feature types. Multiple conductive features may be created concurrently according to various embodiments.

At 408, a dielectric material is deposited into the hole. The dielectric material may occupy all or some of the space where the conductive material was removed from the hole, and may serve to physically and/or electrically isolate the conductive features from one another.

The description above may use perspective-based descriptions such as over/under, top, bottom, etc. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A method, comprising:
    forming a hole in a substrate, wherein the hole includes a first side feature on an outer edge of the hole, and wherein the first side feature traverses a vertical dimension of the hole;
    subsequent to forming the hole in the substrate, depositing conductive material into the hole such that the hole, including the first side feature, is entirely filled with the conductive material; and
    removing a part of the conductive material that occupies a first lengthwise portion of the hole, such that at least one conductive feature that occupies a second lengthwise portion of the hole remains in the substrate, wherein the at least one conductive feature is disposed at least partially within the first side feature.

2. The method of claim 1, further comprising:
    subsequent to the removing the part of the conductive material, depositing a dielectric material into the hole in the first lengthwise portion of the hole.

3. The method of claim 1, wherein:
    the hole includes a plurality of side features on the outer edge of the hole, wherein each of the plurality of side features traverses the vertical dimension of the hole, and the plurality of side features includes the first side feature; and
    the removing the part of the conductive material comprises removing the part of the conductive material such that a plurality of conductive features are correspondingly disposed at least partially in the plurality of side features.

4. The method of claim 3, further comprising:
    subsequent to the removing the part of the conductive material, depositing a dielectric material into the hole in the first lengthwise portion of the hole, wherein the dielectric material deposited into the hole physically separates the plurality of conductive features from each other.

5. The method of claim 3, wherein the plurality of conductive features are physically separate from each other.

6. The method of claim 3, wherein the plurality of conductive features are substantially circular, triangular, or polygonal.

7. The method of claim 1, wherein the part of the conductive material is at least partly removed from a center portion of the hole.

8. The method of claim 1, wherein the hole is substantially circular, polygonal, or irregular shaped.

9. The method of claim 1, wherein forming the hole in the substrate comprises drilling the hole in the substrate.

10. The method of claim 1, wherein the at least one conductive feature disposed at least partially within the first side feature forms a through-silicon via (TSV).

11. The method of claim 1, wherein:
the substrate has (i) first surface and (ii) a second surface that is opposite the first surface; and
the at least one conductive feature extends from the first surface of the substrate to the second surface of the substrate.

12. The method of claim 1, further comprising:
subsequent to forming the hole and prior to depositing the conductive material into the hole, depositing dielectric material into the hole.

13. The method of claim 12, further comprising:
subsequent to depositing the dielectric material into the hole, selectively etching the dielectric material such that the dielectric material is attached to at least sidewalls of the first side feature.

14. The method of claim 1, wherein the first side feature comprises a groove that traverses the vertical dimension of the hole.

15. The method of claim 1, wherein the first side feature comprises a channel that traverses the vertical dimension of the hole.

16. The method of claim 1, wherein the at least one conductive feature is fully disposed within the first side feature.

17. A method, comprising:
forming a hole in a substrate, wherein the hole includes a first side feature on an outer edge of the hole, and wherein the first side feature traverses a vertical dimension of the hole;
subsequent to forming the hole in the substrate, depositing conductive material into the hole such that the first side feature is substantially filled with the conductive material; and
removing a part of the conductive material that occupies a first lengthwise portion of the hole, such that at least one conductive feature that occupies a second lengthwise portion of the hole remains in the substrate, wherein the at least one conductive feature is disposed at least partially within the first side feature, wherein the hole includes a plurality of side features on the outer edge of the hole, wherein each of the plurality of side features traverses the vertical dimension of the hole, wherein the plurality of side features includes the first side feature, and wherein the removing the part of the conductive material comprises
removing the part of the conductive material such that a plurality of conductive features are correspondingly disposed at least partially in the plurality of side features,
wherein a distance between a first conductive feature of the plurality of conductive features and a second conductive feature of the plurality of conductive features is less than 20 μm.

18. A method, comprising:
forming a hole in a substrate, wherein the hole includes a first side feature on an outer edge of the hole, and wherein the first side feature traverses a vertical dimension of the hole;
subsequent to forming the hole in the substrate, depositing conductive material into the hole such that the first side feature is substantially filled with the conductive material; and
removing a part of the conductive material that occupies a first lengthwise portion of the hole, such that at least one conductive feature that occupies a second lengthwise portion of the hole remains in the substrate, wherein the at least one conductive feature is disposed at least partially within the first side feature,
wherein a widest lateral portion of the at least one conductive feature is less than 20 μm.

19. A method, comprising:
forming a hole in a substrate, wherein the hole includes a first side feature and a second side feature on an outer edge of the hole, wherein the first side feature and the second side feature traverse a vertical dimension of the hole;
subsequent to forming the hole in the substrate, depositing conductive material into the hole such that (i) a first portion of the conductive material is deposited in the first side feature, (ii) a second portion of the conductive material is deposited in the second side feature, (iii) a third portion of the conductive material is deposited in the hole, the third portion of the conductive material not being deposited in either the first side feature or the second side feature, and (iv) the first portion, the second portion and the third portion form a contagious section of the conductive material deposited in the hole; and
removing a part of the conductive material that occupies a first lengthwise portion of the hole, such that at least a first conductive feature and a second conductive feature remains in the substrate, wherein the first conductive feature occupies a second lengthwise portion of the hole, wherein the second conductive feature occupies a third lengthwise portion of the hole, wherein the first conductive feature is disposed at least partially within the first side feature, and wherein the second conductive feature is disposed at least partially within the second side feature.

20. The method of claim 19, further comprising:
subsequent to the removing the part of the conductive material, depositing a dielectric material into the hole in the first lengthwise portion of the hole, wherein the dielectric material deposited into the hole physically separates the first conductive feature from the second conductive feature.

21. The method of claim 19, wherein the first conductive feature disposed at least partially within the first side feature forms a through-silicon via (TSV).

22. The method of claim 19, wherein removing the part of the conductive material comprises:
removing at least the third portion of the conductive material.

23. The method of claim 19, wherein the third portion of the conductive material is physically attached to each of the first portion of the conductive material and the second portion of the conductive material.

* * * * *